United States Patent
Kan et al.

(10) Patent No.: US 11,757,216 B2
(45) Date of Patent: Sep. 12, 2023

(54) CLIP PIN FOR A PRINTED CIRCUIT BOARD OF AN INFORMATION HANDLING SYSTEM

(71) Applicant: Dell Products L.P., Round Rock, TX (US)

(72) Inventors: Fong-An Kan, New Taipei (TW); Ming Chu Kuo, New Taipei (TW); Yi-Chu Hsieh, Taoyuan (TW); Chun-Min He, Taipei (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/650,433

(22) Filed: Feb. 9, 2022

(65) Prior Publication Data

US 2023/0253723 A1 Aug. 10, 2023

(51) Int. Cl.
*H01R 12/71* (2011.01)
*H01R 13/426* (2006.01)
*H01R 13/629* (2006.01)

(52) U.S. Cl.
CPC ......... *H01R 12/712* (2013.01); *H01R 13/426* (2013.01); *H01R 13/629* (2013.01)

(58) Field of Classification Search
CPC .. H01R 12/712; H01R 12/523; H01R 13/426; H01R 13/629; H01R 13/4223; H01R 17/187; H05K 1/144; H05K 2201/10303; H05K 2201/10704
See application file for complete search history.

(56) References Cited

U.S. PATENT DOCUMENTS

| | | | | |
|---|---|---|---|---|
| 4,797,113 | A * | 1/1989 | Lambert | H01R 12/52 439/82 |
| 7,393,214 | B2 * | 7/2008 | DiStefano | H01R 12/7082 439/74 |
| 8,210,854 | B2 * | 7/2012 | Orris | H01R 12/7088 439/378 |
| 9,590,329 | B2 * | 3/2017 | Mann | H01R 12/58 |
| 11,201,424 | B2 * | 12/2021 | Kliever | H01R 12/7088 |

* cited by examiner

*Primary Examiner* — Vanessa Girardi
(74) *Attorney, Agent, or Firm* — McDermott Will & Emery LLP

(57) ABSTRACT

In one embodiment, a clip pin of a secondary printed circuit board removably coupled to a primary printed circuit board and a backplate in an information handling system includes: an open end configured to receive a guide pin of the backplate within a clip pin hole of the primary printed circuit board, the guide pin configured to removably couple to the clip pin via the open end; a bulbous portion disposed proximate to the open end, the guide pin causing the bulbous portion to apply an outward force on an inner wall of the clip pin hole; and a plurality of signal pins disposed within the bulbous portion, the outward force causing the plurality of signal pins to communicably couple to the inner wall to transmit a signal from the secondary printed circuit board to the primary printed circuit board.

20 Claims, 8 Drawing Sheets

500

```
┌─────────────────────────────────────────────────────────────────┐
│  RECEIVE, BY A CLIP PIN HOLE OF A PRIMARY PRINTED CIRCUIT BOARD │
│   (PCB), A CLIP PIN OF A SECONDARY PCB VIA A TOP OPENING OF     │
│                       THE CLIP PIN HOLE.                         │
│                              510                                 │
└─────────────────────────────────────────────────────────────────┘
                                 │
                                 ▼
┌─────────────────────────────────────────────────────────────────┐
│   RECEIVE, BY THE CLIP PIN HOLE, A GUIDE PIN OF A BACKPLATE VIA A│
│              BOTTOM OPENING OF THE CLIP PIN HOLE.                │
│                              520                                 │
└─────────────────────────────────────────────────────────────────┘
                                 │
                                 ▼
┌─────────────────────────────────────────────────────────────────┐
│  CAUSE, BY THE GUIDE PIN, THE BULBOUS PORTION OF THE CLIP PIN TO │
│   APPLY AN OUTWARD FORCE ON THE INNER WALL OF THE CLIP PIN HOLE. │
│                              530                                 │
└─────────────────────────────────────────────────────────────────┘
```

FIG. 5

CLIP PIN FOR A PRINTED CIRCUIT BOARD OF AN INFORMATION HANDLING SYSTEM

BACKGROUND

Field of the Disclosure

The disclosure relates generally to information handling systems, and in particular to a clip pin for a printed circuit board of an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one embodiment, a disclosed clip pin of a secondary printed circuit board (PCB) removably coupled to a primary PCB and a backplate in an information handling system includes: an open end configured to receive a guide pin of the backplate within a clip pin hole of the primary PCB, the guide pin configured to removably couple to the clip pin via the open end; a bulbous portion disposed proximate to the open end, the guide pin causing the bulbous portion to apply an outward force on an inner wall of the clip pin hole; and a plurality of signal pins disposed within the bulbous portion, the outward force causing the plurality of signal pins to communicably couple to the inner wall to transmit a signal from the secondary PCB to the primary PCB.

In one or more of the disclosed embodiments, the plurality of signal pins transmits the signal from one or more components disposed on a surface of the secondary PCB to one or more inner layers of the primary PCB via the inner wall.

In one or more of the disclosed embodiments, the secondary PCB is removably coupled to the primary PCB via one or more screws.

In one or more of the disclosed embodiments, the primary PCB and the secondary PCB further include one or more screw holes configured to route the one or more screws through the primary PCB and the secondary PCB.

In one or more of the disclosed embodiments, the backplate further includes one or more threaded inserts configured to receive the one or more screws to removably couple the backplate to the primary PCB and the primary PCB to the secondary PCB.

In one or more of the disclosed embodiments, the clip pin extends orthogonally from a bottom surface of the secondary PCB via a clip pin installation hole.

In one or more of the disclosed embodiments, the guide pin extends orthogonally from a top surface of the backplate.

In one or more of the disclosed embodiments, the clip pin extends through a top opening of the clip pin hole.

In one or more of the disclosed embodiments, the guide pin extends through a bottom opening of the clip pin hole into the open end of the clip pin.

The details of one or more embodiments of the subject matter described in this specification are set forth in the accompanying drawings and the description below. Other potential features, aspects, and advantages of the subject matter will become apparent from the description, the drawings, and the claims.

BRIEF DESCRIPTION OF DRAWINGS

FIG. 5 is a flowchart depicting a method for removably coupling a primary PCB to a secondary PCB in an information handling system.

DESCRIPTION OF PARTICULAR EMBODIMENT(S)

This document describes a clip pin of a secondary printed circuit board (PCB) removably coupled to a primary PCB and a backplate in an information handling system that includes: an open end configured to receive a guide pin of the backplate within a clip pin hole of the primary PCB, the guide pin configured to removably couple to the clip pin via the open end; a bulbous portion disposed proximate to the open end, the guide pin causing the bulbous portion to apply an outward force on an inner wall of the clip pin hole; and a plurality of signal pins disposed within the bulbous portion, the outward force causing the plurality of signal pins to communicably couple to the inner wall to transmit a signal from the secondary PCB to the primary PCB.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-5 wherein like numbers are used to indicate like and corresponding parts.

Figure 1:
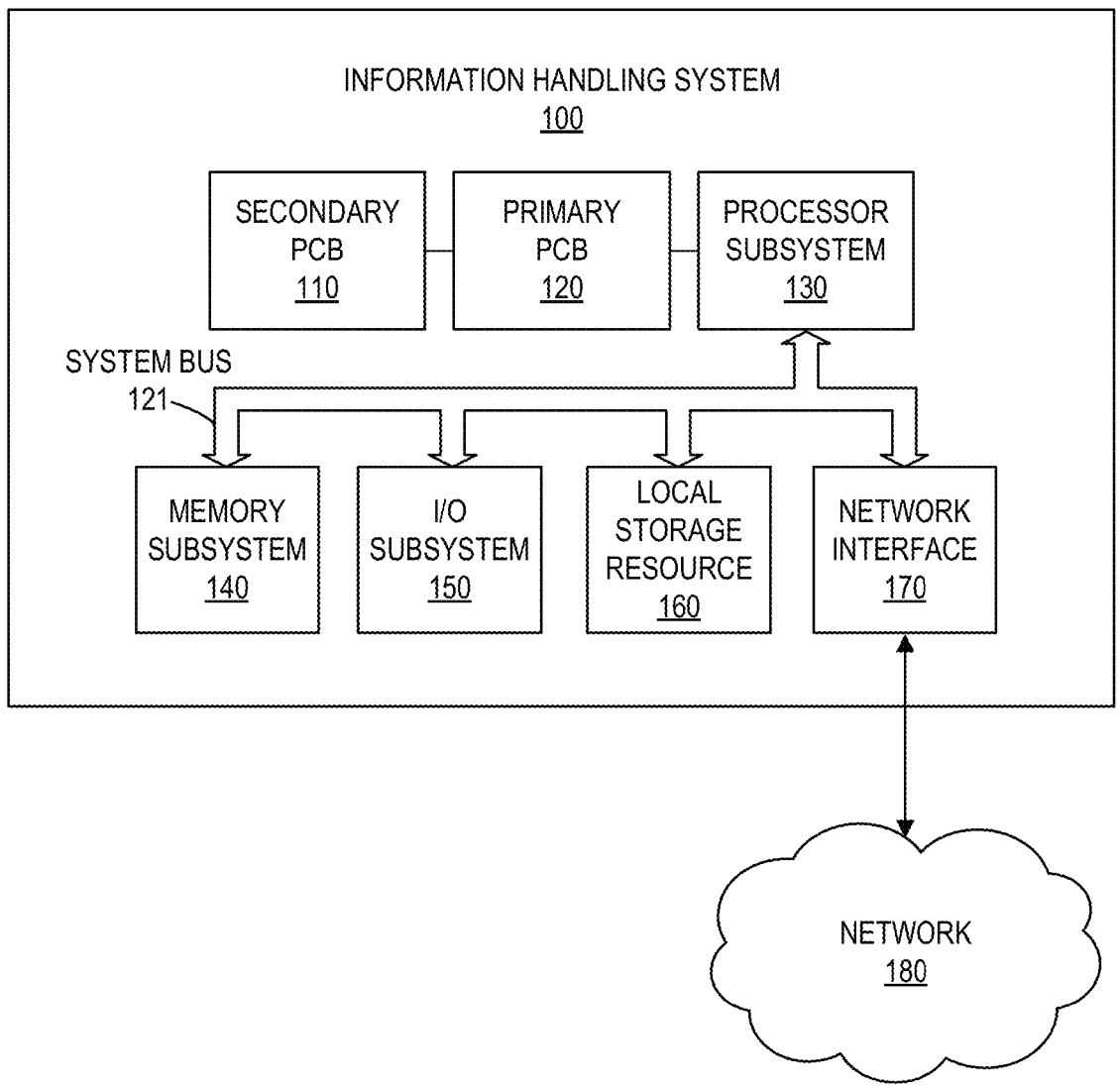
FIG. 1 is a block diagram of a computing environment that includes an information handling system.

Turning now to the drawings, FIG. 1 is a block diagram of selected elements of an embodiment of a computing environment that includes an information handling system. Specifically, FIG. 1 illustrates a block diagram depicting selected elements of an information handling system 100 in accordance with some embodiments of the present disclosure. In other embodiments, information handling system 100 may represent different types of portable information handling systems, such as, display devices, head mounted displays, head mount display systems, smart phones, tablet computers, notebook computers, media players, foldable display systems, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems.

In the embodiment illustrated in FIG. 1, components of information handling system 100 may include, but are not limited to, a processor subsystem 130, which may comprise one or more processors, and system bus 121 that communicatively couples various system components to processor subsystem 130 including, for example, a memory subsystem 140, an I/O subsystem 150, a local storage resource 160, and a network interface 170. System bus 121 may represent a variety of suitable types of bus structures (e.g., a memory bus, a peripheral bus, or a local bus) using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express (PCIe) bus, HyperTransport (HT) bus, and Video Electronics Standards Association (VESA) local bus. As shown in FIG. 1, information handling system 100 may additionally include a primary printed circuit board (PCB) 120 and a secondary PCB 110. In other embodiments, computing environment 190 may include additional, fewer, and/or different components than the components shown in FIG. 1.

In information handling system 100, processor subsystem 130 may comprise a system, device, or apparatus operable to interpret and/or execute program instructions and/or process data, and may include a central processing unit (CPU), microprocessor, microcontroller, digital signal processor (DSP), application specific integrated circuit (ASIC), or another digital or analog circuitry configured to interpret and/or execute program instructions and/or process data. In some embodiments, processor subsystem 130 may interpret and/or execute program instructions and/or process data stored locally (e.g., in memory subsystem 140 and/or another component of information handling system 100). In the same or alternative embodiments, processor subsystem 130 may interpret and/or execute program instructions and/or process data stored remotely. In one embodiment, processor subsystem 130 may be or include a multi-core processor comprised of one or more processing cores disposed upon an integrated circuit (IC) chip. In other embodiments, processor subsystem 130 may be or include an integrated device (e.g., microcontroller, system on a chip (SoC), and the like) that includes dedicated memory, peripheral interfaces, and/or other components suitable for interpreting and/or executing program instructions and/or processing data.

In one embodiment, memory subsystem 140 may comprise a system, device, or apparatus operable to retain and/or retrieve program instructions and/or data for a period of time (e.g., computer-readable media). Memory subsystem 140 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In one embodiment, I/O subsystem 150 may comprise a system, device, or apparatus generally operable to receive and/or transmit data to, from, and/or within information handling system 100. I/O subsystem 150 may represent, for example, a variety of communication interfaces, graphics interfaces, video interfaces, user input interfaces, and/or peripheral interfaces. In various embodiments, I/O subsystem 150 may be used to support various peripheral devices, such as a touch panel, a display adapter, a keyboard, an accelerometer, a touch pad, a gyroscope, an IR sensor, a microphone, a sensor, a camera, or another type of peripheral device.

In one embodiment, local storage resource 160 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data.

In one embodiment, network interface 170 may be a suitable system, apparatus, or device operable to serve as an interface between information handling system 100 and a network 180. Network interface 170 may enable information handling system 100 to communicate over network 180 using a suitable transmission protocol and/or standard, including, but not limited to, transmission protocols and/or standards enumerated below with respect to the discussion of network 180. Network 180 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), a Cloud network, an Edge network, an intranet, the Internet or another appropriate architecture or system that facilitates the communication of signals, data and/or messages (generally referred to as data). Network interface 170 may enable wired and/or wireless communications (e.g., NFC or Bluetooth) to and/or from information handling system 100.

In particular embodiments, network 180 may include one or more routers for routing data between client information handling systems 100 and server information handling systems 100. A device (e.g., a client information handling system 100 or a server information handling system 100) on network 180 may be addressed by a corresponding network address including, for example, an Internet protocol (IP) address, an Internet name, a Windows Internet name service (WINS) name, a domain name or other system name. In particular embodiments, network 180 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

In one embodiment, network 180 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 180 and its various components may be implemented using hardware, software, or any combination thereof.

In one embodiment, primary PCB 120 may be a suitable system, apparatus, or device operable to provide a substrate upon which one or more components of information handling system 100 may be disposed. In particular, primary PCB 120 may be comprised of conductive and insulating layers operable to provide a structure on which one or more components (e.g., processor subsystem 130, memory subsystem 140, local storage resource 160, and the like) may be communicably coupled within information handling system 100. For example, primary PCB 120 may be or include a motherboard of information handling system 100 operable to communicably couple one or more components such that the one or more components may perform respective computing operations. In one embodiment, primary PCB 120 may include one or more vias, or "clip pin holes," operable for transferring signals through primary PCB 120 (e.g., clip pin holes 250 shown in FIG. 2A). Specifically, each clip pin hole may include a conductive inner wall operable for transferring signals from a daughterboard (e.g., secondary PCB 110) to one or more inner layers of primary PCB 120. For example, clip pin holes 250 (shown in FIG. 2A) may transfer one or more high-speed signals from one or more components disposed on a surface of secondary PCB 110 to one or more inner layers of primary PCB 120. Primary PCB 120 is described in further detail with respect to FIGS. 2A-3B.

In one embodiment, secondary PCB 110 may be a suitable system, apparatus, or device operable to provide a substrate upon which one or more components of information handling system 100 may be disposed. In particular, secondary PCB 110 may be comprised of conductive and insulating layers operable to provide a structure on which one or more components (e.g., audio amplifier integrated circuits (ICs), ethernet ICs, local area network (LAN) ICs, and the like) may be communicably coupled within information handling system 100. For example, secondary PCB 110 may be or include a daughterboard of information handling system 100 operable to communicably couple one or more components to primary PCB 120 such that the one or more components may perform respective computing operations and/or send/receive signals to/from one or more components of primary PCB 120.

Conventionally, a PCB may include a surface upon which one or more components may be disposed. Such components may be or include electronic components that require solder (e.g., surface-mount devices) during an assembly process. For example, surface-mount technology (SMT) components may include one or more pins that require soldering to one or more conductive pads of a conventional PCB during an assembly process at a manufacturer such that the SMT components may send and/or receive signals via the one or more pins. However, such soldering of electronic components during the assembly process may be time-consuming, often requiring several months to complete. Further, such assembly processes may require reconfigurations to existing architecture within the conventional PCB in response to material shortages and/or increased consumer demand for components that may not have been included in a current design. For example, an industry shortage of an audio amplifier IC supporting a particular codec may require a manufacturer to incorporate a different audio amplifier IC supporting a different codec. Such changes may create, or contribute to, an assembly backlog for the manufacturer, that may result in increased wait times and/or higher prices for consumers. In contrast, secondary PCB 110 may be removably coupled to primary PCB 120 such that one or more components of secondary PCB 110 may perform respective computing operations and/or send/receive signals to/from one or more components of primary PCB 120. In particular, secondary PCB 110 may include one or more clip pins (e.g., clip pins 230 shown in FIG. 2A) operable to removably couple to a guide pin (e.g., guide pins 280 shown in FIG. 2A) of a backplate within a clip pin hole (e.g., clip pin holes 250 shown in FIG. 2A) of primary PCB 120. Secondary PCB 110 is described in further detail with respect to FIGS. 2A-4B.

Figure 2A:
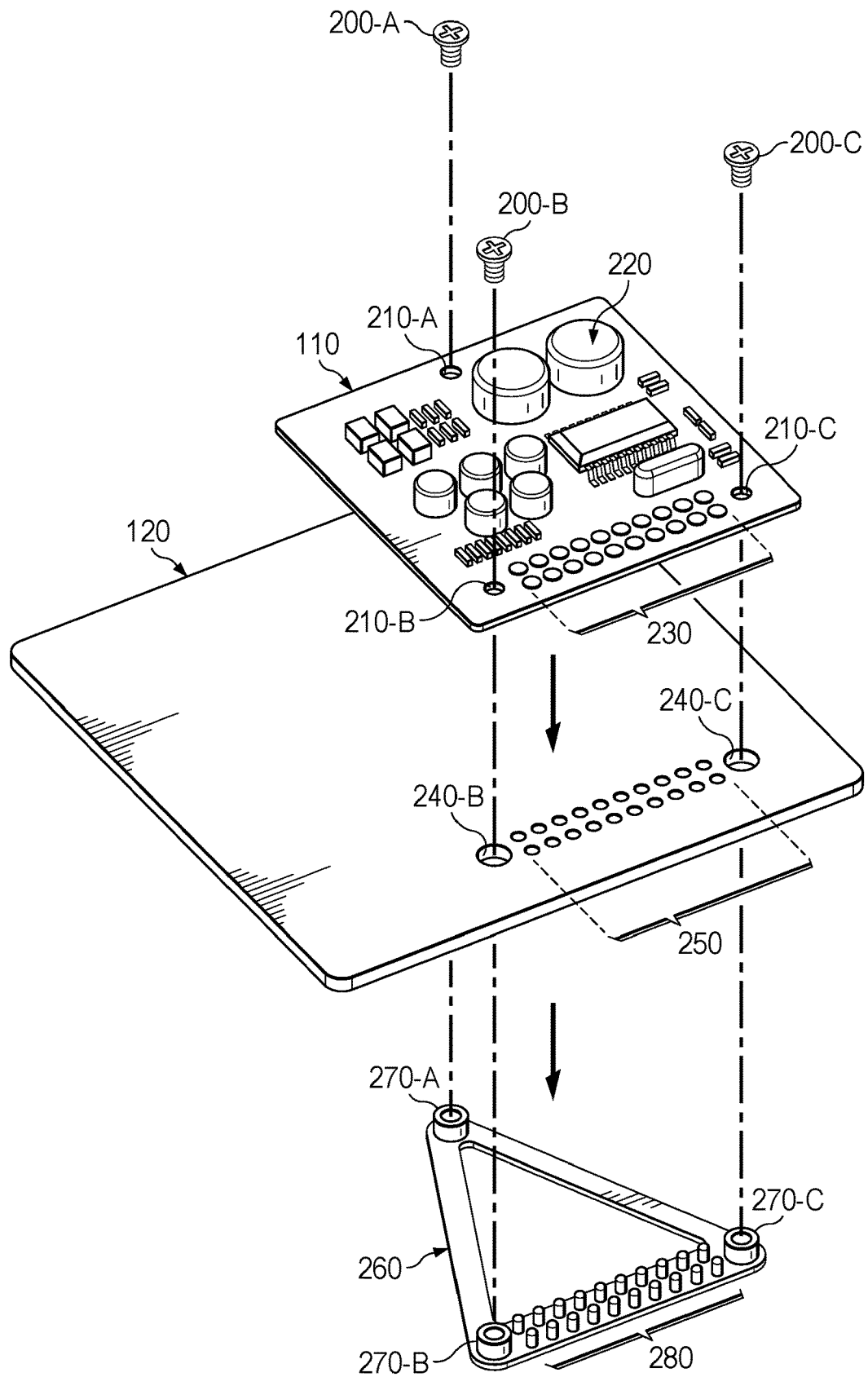
FIGS. 2A and 2B illustrate a primary printed circuit board (PCB), a secondary PCB, and a backplate.
Figure 2B:
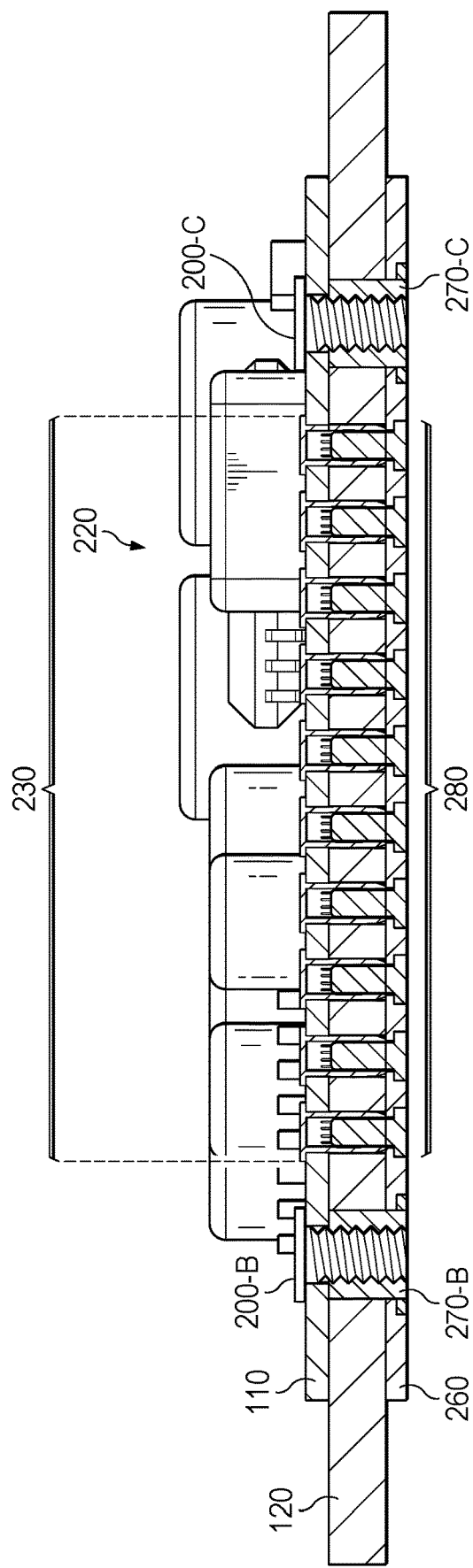

FIGS. 2A and 2B illustrate selected elements of an embodiment of a primary printed circuit board (PCB), a secondary PCB, and a backplate. Specifically, FIG. 2A illustrates secondary PCB 110, primary PCB 120, and backplate 260 prior to an assembly process in which secondary PCB 110, primary PCB 120, and backplate 260 are removably coupled. FIG. 2B illustrates secondary PCB 110, primary PCB 120, and backplate 260 following an assembly process in which secondary PCB 110, primary PCB 120, and backplate 260 are removably coupled via screws 200-A through 200-C. In other embodiments, secondary PCB 110, primary PCB 120, and/or backplate 260 may include additional, fewer, and/or different components than the components shown in FIGS. 2A and 2B.

In one embodiment, each screw 200-A through 200-C (collectively referred to herein as "screws 200") may be a suitable system, apparatus, or device operable to removably couple secondary PCB 110, primary PCB 120, and backplate 260. In particular, primary PCB 120 and secondary PCB 110 may each include one or more screw holes operable to route screws 200 through primary PCB 120 and secondary PCB 110. In the embodiment illustrated in FIGS. 2A and 2B, primary PCB 120 includes screw holes 240-A (not shown in figure), 240-B and 240-C (collectively referred to herein as "screw holes 240") disposed proximate to clip pin holes 250. Similarly, secondary PCB 110 includes screw holes 210-A, 210-B, and 210-C (collectively referred to herein as "screw holes 210"), where screw holes 210-B and 210-C are disposed proximate to clip pins 230. In addition, backplate 260 includes threaded inserts 270-A, 270-B, and 270-C (collectively referred to herein as "threaded inserts 270") operable to receive screws 200 to removably couple backplate 260 to primary PCB 120 and primary PCB 120 to secondary PCB 110 as shown in FIG. 2B. That is, an administrator and/or manufacturer of information handling system 100 may insert screws 200 through screw holes 210 of secondary PCB 110 and screw holes 240 of primary PCB 120 such that each screw 200 may be received by threaded inserts 270 to removably couple secondary PCB 110, primary PCB 120, and backplate 260 as shown in FIG. 2B. As shown in FIG. 2B, screw 200-B has been received by threaded insert 270-B and screw 200-C has been received by threaded insert 270-C, thereby removably coupling backplate 260 to primary PCB 120 and primary PCB 120 to secondary PCB 110.

In one embodiment, each clip pin 230 (collectively referred to herein as "clip pins 230") may be a suitable system, apparatus, or device operable to transfer a signal from secondary PCB 110 to primary PCB 120. Specifically, each clip pin 230 may transfer a respective signal from respective components 220 disposed on the surface of secondary PCB 110 (e.g., via one or more traces not shown in figure) to one or more inner layers of primary PCB 120. Additionally, each clip pin 230 may removably couple to a guide pin 280 of backplate 260. Clip pins 230 may removably couple to guide pins 280 within clip pin holes 250 of primary PCB 120 as shown in FIG. 2B. Each clip pin hole 250 of primary PCB 120 may include a conductive inner wall operable for transferring signals from secondary PCB 110 to one or more inner layers of primary PCB 120. For example, clip pin holes 250 may transfer one or more high-speed signals from components 220 disposed on the surface of secondary PCB 110 to one or more inner layers of primary PCB 120. In one embodiment, each clip pin 230 may be comprised of a rigid conductive material (e.g., copper, silver, aluminum, gold-plated alloy, and the like) such that clip pin 230 may transfer a signal from secondary PCB 110 to primary PCB 120. Clip pins 230 are described in further detail with respect to FIGS. 3A-4B.

Figure 3A:
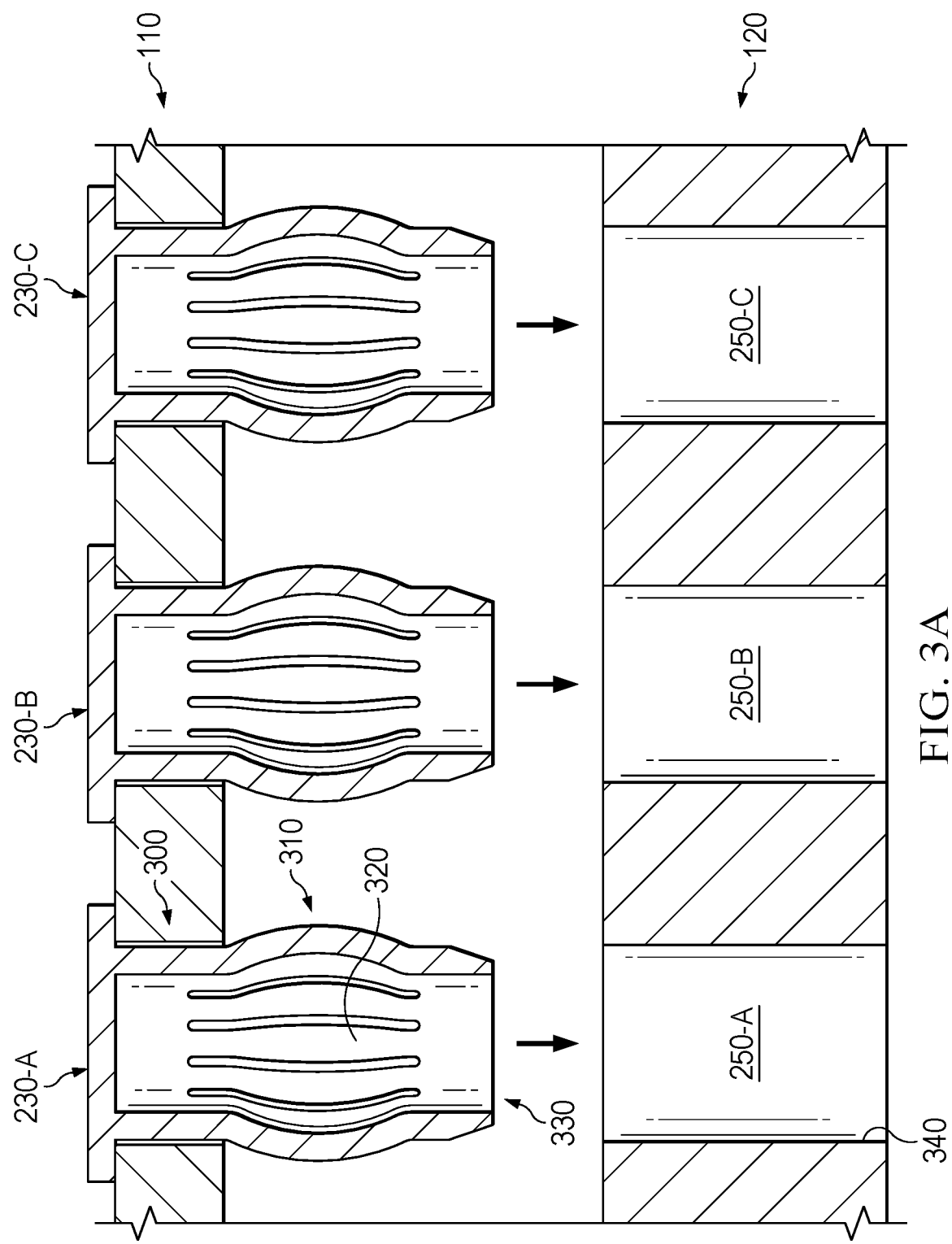
FIGS. 3A and 3B illustrate clip pins of a secondary PCB coupled to guide pins of a backplate.
Figure 3B:
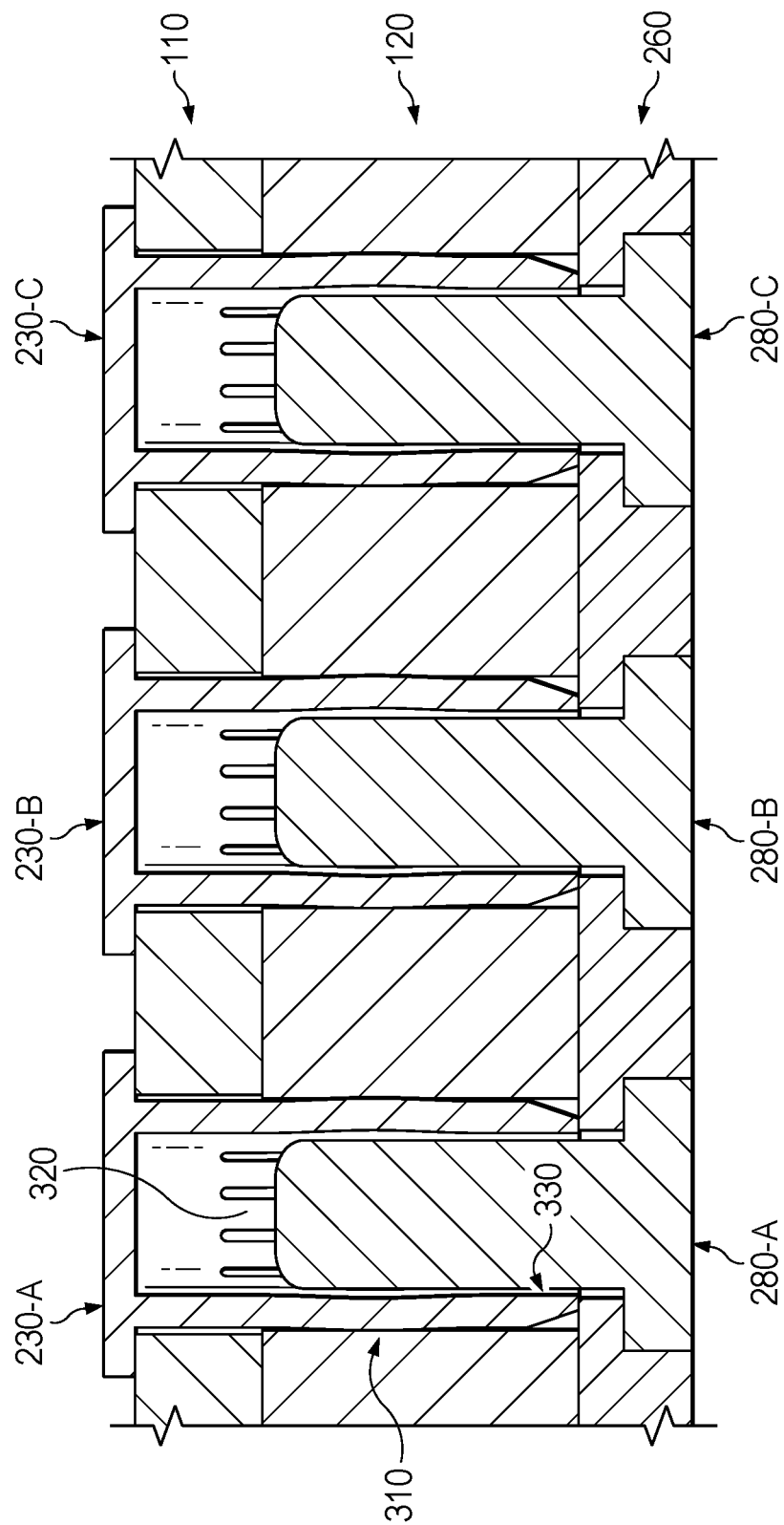

FIGS. 3A and 3B illustrate selected elements of an embodiment of clip pins of a secondary PCB coupled to guide pins of a backplate. Specifically, FIG. 3A illustrates clip pins 230-A, 230-B, and 230-C of secondary PCB 110 being received by clip pin holes 250-A, 250-B, and 250-C, respectively, of primary PCB 120. FIG. 3B illustrates clip pins 230-A, 230-B, and 230-C removably coupled to guide pins 280-A, 280-B, and 280-C, respectively, of backplate 260 within clip pin holes 250 of primary PCB 120. As shown in FIGS. 3A and 3B, each clip pin 230 may extend orthogonally from a bottom surface of secondary PCB 110, and may include a bulbous portion 310, one or more signal pins 320 disposed within bulbous portion 310, and an open end 330. In one embodiment, bulbous portion 310 may comprise a portion of clip pin 230 having a larger circumference than main body 300 of clip pin 230. Each signal pin 320 disposed within bulbous portion 310 may be configured to transmit a signal from secondary PCB 110 to primary PCB 120. In other embodiments, secondary PCB 110, primary PCB 120, and/or backplate 260 may include additional, fewer, and/or different components than the components shown in FIGS. 3A and 3B.

To transmit a signal, each clip pin 230 may extend through a top opening of clip pin hole 250 as shown in FIGS. 3A and 3B. Each guide pin 280 of backplate 260 may extend orthogonally from a top surface of backplate 260 and may be configured to removably couple to clip pin 230 via open end 330 within clip pin hole 250 as shown in FIG. 3B. That is, guide pin 280 may extend through a bottom opening of clip pin hole 250 into open end 330 of clip pin 230. Once removably coupled, guide pin 280 may cause bulbous portion 310 of clip pin 230 to apply an outward force on the inner wall 340 of clip pin hole 250 (as indicated by the shaded area of bulbous portion 310 shown in FIG. 3B). The outward force applied by bulbous portion 310 may cause signal pins 320 to communicably couple to the inner wall 340 of clip pin hole 250 (via bulbous portion 310) to transmit a signal. Specifically, signal pins 320 may transmit the signal from components 220 (shown in FIGS. 2A and 2B) disposed on a surface of secondary PCB 110 to one or more inner layers of primary PCB 120 via the inner wall 340.

Figure 4A:
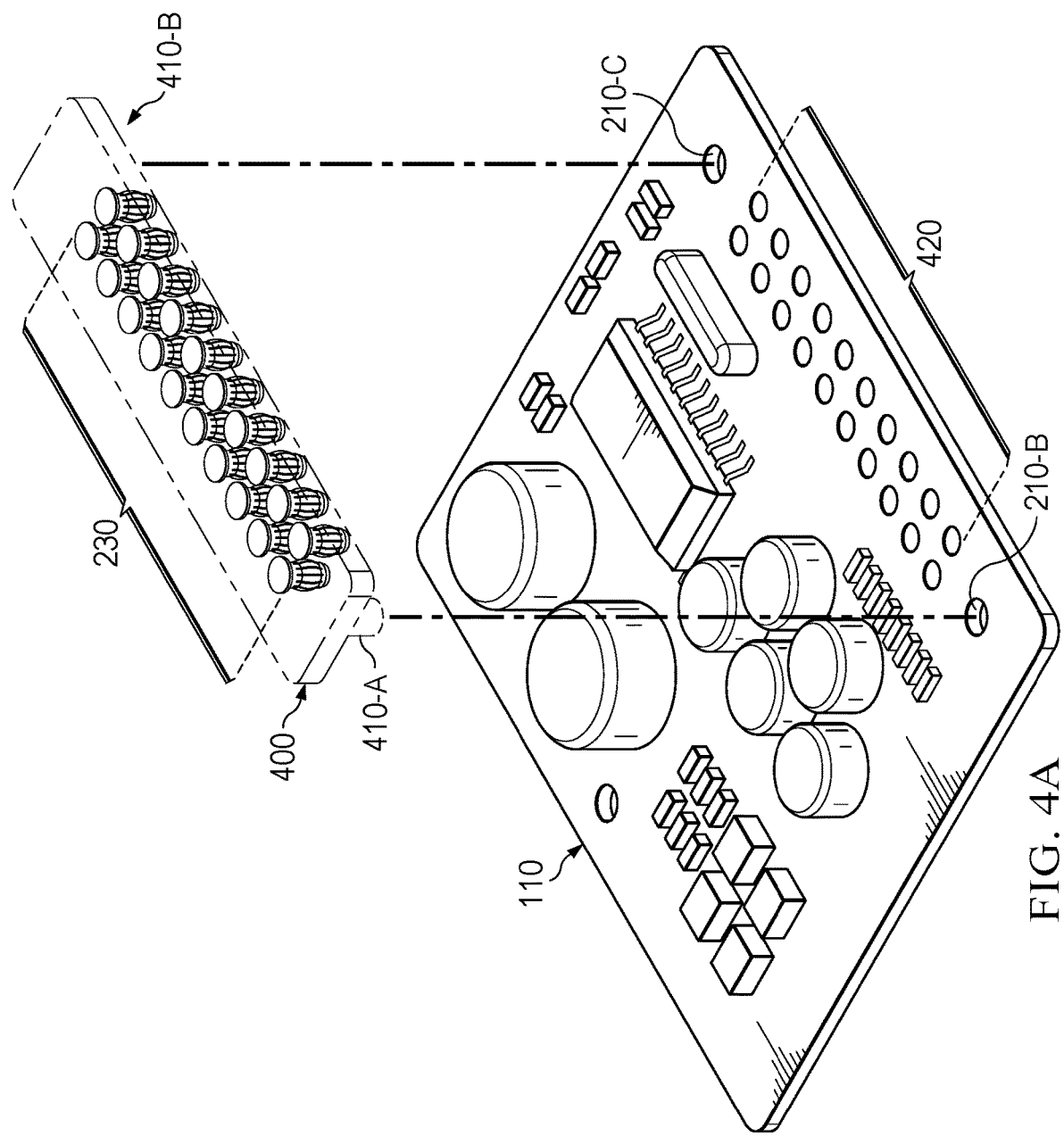
FIGS. 4A and 4B illustrate clip pin installation in a secondary PCB.
Figure 4B:
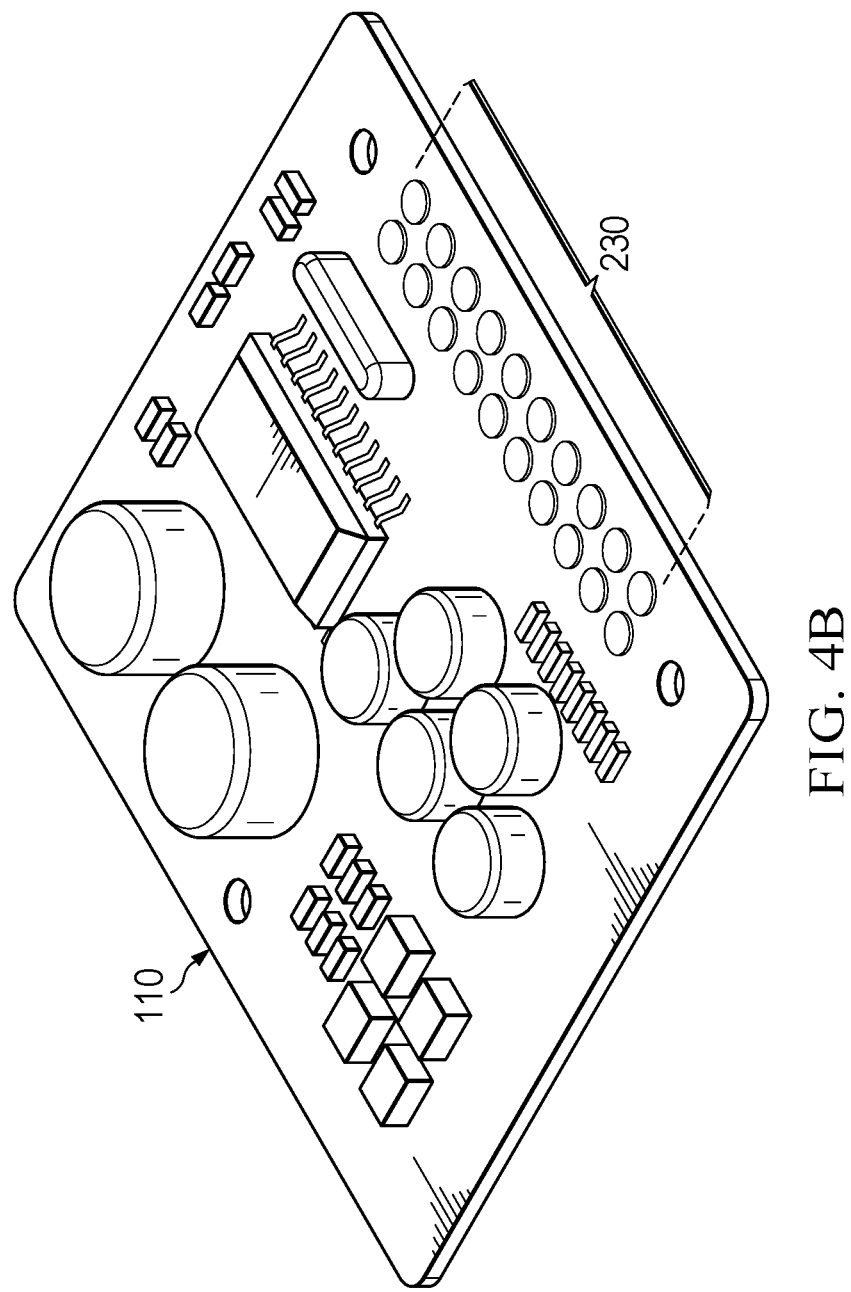

FIGS. 4A and 4B illustrate selected elements of an embodiment of clip pin installation in a secondary PCB. Specifically, FIG. 4A illustrates clip pins 230 arranged within a clip pin tray 400. Clip pin tray 400 includes installation pins 410-A and 410-B extending orthogonally from the bottom surface of clip pin tray 400. As shown in FIG. 4A, installation pins 410-A and 410-B may be configured to align with screw holes 210-B and 210-C, respectively, of secondary PCB 110 such that each clip pin 230 arranged within clip pin tray 400 may properly align with clip pin installation holes 420 (e.g., during an assembly process). FIG. 4B illustrates clip pins 230 coupled to clip pin installation holes 420. In the embodiment illustrated in FIG. 4B, each clip pin 230 may be soldered within a respective clip pin installation hole 420 such that clip pins 230 extend orthogonally from the bottom surface of secondary PCB 110 via clip pin installation hole 420. Once installed, clip pin tray 400 may be removed as shown in FIG. 4B such that secondary PCB 110 may be removably coupled to primary PCB 120 as shown in FIG. 2B. In other embodiments, secondary PCB 110 may include additional, fewer, and/or different components than the components shown in FIGS. 4A and 4B.

FIG. 5 is a flowchart depicting selected elements of an embodiment of a method for removably coupling a primary PCB to a secondary PCB in an information handling system. It is noted that certain operations described in method 500 may be optional or may be rearranged in different embodiments.

Method 500 may begin at step 510, where a clip pin hole of the primary PCB may receive a clip pin of the secondary PCB via a top opening of the clip pin hole. The clip pin hole may have an inner wall. The clip pin may have a bulbous portion disposed proximate to an open end of the clip pin. The clip pin may further include signal pins disposed within the bulbous portion. For example, each clip pin 230 may include a bulbous portion 310, one or more signal pins 320 disposed within bulbous portion 310, and an open end 330 as described above with respect to FIGS. 3A and 3B. Each signal pin 320 disposed within bulbous portion 310 may be configured to transmit a signal from secondary PCB 110 to primary PCB 120 as described above with respect to FIGS. 3A and 3B. To transmit a signal, each clip pin 230 may extend through a top opening of clip pin hole 250 as shown in FIGS. 3A and 3B. In step 520, the clip pin hole may receive a guide pin of a backplate via a bottom opening of the clip pin hole. The guide pin may be configured to removably couple to the clip pin via the open end. For example, each guide pin 280 of backplate 260 may extend orthogonally from a top surface of backplate 260 and may be configured to removably couple to clip pin 230 via open end 330 within clip pin hole 250 as shown in FIG. 3B. Guide pin 280 may extend through a bottom opening of clip pin hole 250 into open end 330 of clip pin 230 as described above with respect to FIGS. 3A and 3B. In step 530, the guide pin may cause the bulbous portion of the clip pin to apply an outward force on the inner wall of the clip pin hole. The outward force may cause the signal pins to communicably couple to the inner wall to transmit a signal from the secondary PCB to the primary PCB. For example, guide pin 280 may cause bulbous portion 310 of clip pin 230 to apply an outward force on the inner wall 340 of clip pin hole 250 (as indicated by the shaded area of bulbous portion 310 shown in FIG. 3B). The outward force applied by bulbous portion 310 may cause signal pins 320 to communicably couple to the inner wall 340 of clip pin hole 250 (via bulbous portion 310) to transmit a signal as described above with respect to FIGS. 3A and 3B. Specifically, signal pins 320 may transmit the signal from components 220 (shown in FIGS. 2A and 2B) disposed on a surface of secondary PCB 110 to one or more inner layers of primary PCB 120 via the inner wall 340 as described above with respect to FIGS. 3A and 3B.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An information handling system, comprising:
   a primary printed circuit board (PCB) including a clip pin hole having an inner wall;
   a secondary PCB removably coupled to the primary PCB, the secondary PCB including a clip pin having:
   an open end;
   a bulbous portion disposed proximate to the open end; and
   a plurality of signal pins disposed within the bulbous portion, the plurality of signal pins configured to transmit a signal from the secondary PCB to the primary PCB; and
   a backplate including a guide pin configured to removably couple to the clip pin via the open end, the guide pin causing the bulbous portion of the clip pin to apply an outward force on the inner wall of the clip pin hole, the outward force causing the plurality of signal pins to communicably couple to the inner wall to transmit the signal.

2. The information handling system of claim 1, wherein the plurality of signal pins transmits the signal from one or more components disposed on a surface of the secondary PCB to one or more inner layers of the primary PCB via the inner wall.

3. The information handling system of claim 1, wherein the clip pin extends orthogonally from a bottom surface of the secondary PCB via a clip pin installation hole.

4. The information handling system of claim 1, wherein the guide pin extends orthogonally from a top surface of the backplate.

5. The information handling system of claim 1, wherein the clip pin extends through a top opening of the clip pin hole.

6. The information handling system of claim 1, wherein the guide pin extends through a bottom opening of the clip pin hole into the open end of the clip pin.

7. The information handling system of claim 1, wherein the secondary PCB is removably coupled to the primary PCB via one or more screws.

8. The information handling system of claim 7, wherein the primary PCB and the secondary PCB further include one or more screw holes configured to route the one or more screws through the primary PCB and the secondary PCB.

9. The information handling system of claim 7, wherein the backplate further includes one or more threaded inserts configured to receive the one or more screws to removably couple the backplate to the primary PCB and the primary PCB to the secondary PCB.

10. A method for removably coupling a primary printed circuit board (PCB) to a secondary PCB in an information handling system, the method comprising:
    receiving, by a clip pin hole of the primary PCB, a clip pin of the secondary PCB via a top opening of the clip pin hole, the clip pin hole having an inner wall, the clip pin having a bulbous portion disposed proximate to an open end of the clip pin, the clip pin further including a plurality of signal pins disposed within the bulbous portion;
    receiving, by the clip pin hole, a guide pin of a backplate via a bottom opening of the clip pin hole, the guide pin configured to removably couple to the clip pin via the open end;
    causing, by the guide pin, the bulbous portion of the clip pin to apply an outward force on the inner wall of the clip pin hole, the outward force causing the plurality of signal pins to communicably couple to the inner wall to transmit a signal from the secondary PCB to the primary PCB.

11. The method of claim 10, wherein transmitting the signal from the secondary PCB to the primary PCB comprises:
   receiving, by the plurality of signal pins, the signal from one or more components disposed on a surface of the secondary PCB; and
   sending, by the plurality of signal pins, the signal to one or more inner layers of the primary PCB via the inner wall.

12. A clip pin of a secondary printed circuit board (PCB) removably coupled to a primary PCB and a backplate in an information handling system, the clip pin including:
   an open end configured to receive a guide pin of the backplate within a clip pin hole of the primary PCB, the guide pin configured to removably couple to the clip pin via the open end;
   a bulbous portion disposed proximate to the open end, the guide pin causing the bulbous portion to apply an outward force on an inner wall of the clip pin hole; and
   a plurality of signal pins disposed within the bulbous portion, the outward force causing the plurality of signal pins to communicably couple to the inner wall to transmit a signal from the secondary PCB to the primary PCB.

13. The clip pin of claim 12, wherein the plurality of signal pins transmits the signal from one or more components disposed on a surface of the secondary PCB to one or more inner layers of the primary PCB via the inner wall.

14. The clip pin of claim 12, wherein the clip pin extends orthogonally from a bottom surface of the secondary PCB via a clip pin installation hole.

15. The clip pin of claim 12, wherein the guide pin extends orthogonally from a top surface of the backplate.

16. The clip pin of claim 12, wherein the clip pin extends through a top opening of the clip pin hole.

17. The clip pin of claim 1, wherein the guide pin extends through a bottom opening of the clip pin hole into the open end of the clip pin.

18. The clip pin of claim 12, wherein the secondary PCB is removably coupled to the primary PCB via one or more screws.

19. The clip pin of claim 18, wherein the primary PCB and the secondary PCB further include one or more screw holes configured to route the one or more screws through the primary PCB and the secondary PCB.

20. The clip pin of claim 18, wherein the backplate further includes one or more threaded inserts configured to receive the one or more screws to removably couple the backplate to the primary PCB and the primary PCB to the secondary PCB.

* * * * *